United States Patent
Sano et al.

(10) Patent No.: US 6,358,633 B1
(45) Date of Patent: Mar. 19, 2002

(54) ORGANIC ELECTROLUMINESCENCE ELEMENT

(75) Inventors: Takeshi Sano, Kagawa; Yoshitaka Nishio, Hirakata, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/308,818

(22) PCT Filed: Apr. 27, 1998

(86) PCT No.: PCT/JP98/01947

§ 371 Date: May 26, 1999

§ 102(e) Date: May 26, 1999

(87) PCT Pub. No.: WO98/51757

PCT Pub. Date: Nov. 19, 1998

(30) Foreign Application Priority Data

May 15, 1997 (JP) ................................................ 9-125192

(51) Int. Cl.$^7$ ................................................ H05B 33/14
(52) U.S. Cl. ........................ 428/690; 428/917; 428/212; 313/504; 257/102; 257/103
(58) Field of Search ................................ 428/690, 917, 428/212; 313/504, 506; 257/102, 103

(56) References Cited

U.S. PATENT DOCUMENTS 5,281,489 A * 1/1994 Mori et al. .................. 428/690
5,601,903 A 2/1997 Fujii et al. .................. 428/212

OTHER PUBLICATIONS

Wada et al; Applied Surface Science 65/66 (1993) pp. 376–380, (No Month).

D. J. Fatemi et al; Synthetic Metals, 85 (1997) pp. 1225–1228, (No Month).

Yugi Hamada et al; Jpn. J. Appl. Phys. vol. 34 (1995) pp. L824–L826, (No Month).

M. Yoshida et al; Synthetic Metals, 71 (1995) pp. 2111–2112, (No Month).

* cited by examiner

*Primary Examiner*—Marie Yamnitzky
(74) *Attorney, Agent, or Firm*—Armstrong, Westeran & Hattori, LLP (57) ABSTRACT

In an organic electroluminescent device constructed by providing at least an emitting layer using an organic material between a hole injection electrode and an electron injection electrode, in forming an emitting layer having a dopant doped into a host material, a dopant having a condensed ring obtained by condensing three or more rings is used, and the difference between the highest occupied molecular orbital in the host material and the highest occupied molecular orbital in the dopant is in a range from −0.3 eV to +0.3 eV.

9 Claims, 3 Drawing Sheets

ORGANIC ELECTROLUMINESCENCE ELEMENT

TECHNICAL FIELD

The present invention relates to an organic electroluminescent device constructed by forming at least an emitting layer using an organic material between a hole injection electrode and an electron injection electrode, and is characterized in that stable luminance can be obtained for a long time, and high luminance can be obtained at a low voltage particularly in an organic electroluminescent device having an emitting layer constructed by doping a dopant into a host material.

BACKGROUND ART

In recent years, the needs of flat panel display devices the consumption of electric power and the size of which are smaller than those of a CRT (cathode-ray Tube) which has been heretofore generally employed have been increased as information equipments are diversified, for example. An electroluminescent device has been paid attention to as one of the flat panel display devices.

The electroluminescent device is roughly divided into an inorganic electroluminescent device and an organic electroluminescent device depending on a used material.

The inorganic electroluminescent device is so adapted that a high electric field is generally applied on a luminance portion, and electrons are accelerated within the high electric field to collide with a luminescence center, whereby the luminescence center is excited to emit light. On the other hand, the organic electroluminescent device is so adapted that electrons and holes are respectively injected into a luminescent portion from an electron injection electrode and a hole injection electrode, the electrons and the holes thus injected are recombined with each other in a luminescence center to bring an organic molecule into its excited state, and the organic molecule emits fluorescence when it is returned from the excited state to its ground state.

In the case of the inorganic electroluminescent device, a high voltage of 100 to 200 volts is required as its driving voltage because the high electric field is applied as described above. On the other hand, the organic electroluminescent derive can be driven at a low voltage of approximately 5 to 20 volts.

In the case of the organic electroluminescent device, a luminescent device emitting light in a suitable color can be obtained by selecting a fluorescent material that is a luminescent material. It is expected that the organic electroluminescent device can be also utilized as a multi-color or full-color display device, for example. Further, it is considered that the organic electroluminescent device is utilized as a back light of a liquid crystal display device or the like because it can emit light at a low voltage.

In recent years, various studies have been conducted on such an organic electroluminescent device.

In such an organic electroluminescent device, an emitting layer and a carrier transport layer which is constituted by a hole transport layer for transporting holes to the emitting layer and an electron transport layer for transporting electrons thereto are generally provided between a hole injection electrode and an electron injection electrode. Specifically, used as the structure thereof are a three-layer structure referred to as a DH structure obtained by laminating a hole transport layer, an emitting layer and an electron transport layer between a hole injection electrode and an electron injection electrode, a two-layer structure referred to as an SH-A structure obtained by laminating a hole transport layer and an emitting layer abundant in electron transport properties between a hole injection electrode and an electron injection electrode, and a two-layer structure referred to as an SH-B structure obtained by laminating an emitting layer abundant in hole transporting properties and an electron transport layer between a hole injection electrode and an electron injection electrode.

In a conventional organic electroluminescent device, however, it is generally difficult to obtain as an organic material used for its emitting layer high-purity one by sublimation and purification, for example, and the stability of the organic material to heat or the like is not sufficient. When the organic electroluminescent device emits light for a long time, therefore, some problems occur. For example, the organic material used for the emitting layer is crystallized to form pinholes due to heat or the like at the time of the light emission, so that uniform and sufficient luminance cannot be obtained for a long time.

In recent years, in order to increase luminous efficiency in the emitting layer in the organic electroluminescent device, a dopant having a high quantum efficiency of fluorescent has been doped into a host material constituting the emitting layer.

In thus doping the dopant into the host material constituting the emitting layer, however, there are some problems. For example, unless a combination of the host material and the dopant is suitably selected, sufficient luminance cannot be obtained.

An object of the present invention is to solve the above-mentioned problems in an organic electroluminescent device constructed by forming at least an emitting layer using an organic material between a hole injection electrode and an electron injection electrode.

That is, an object of the present invention is to make it possible to obtain stable luminance for a long time by preventing pinholes from being formed by crystallization of an organic material used for an emitting layer due to heat or the like at the time of emitting light as in the conventional example.

Another object of the present invention is to make it possible to obtain, in an organic electroluminescent device having an emitting layer obtained by doping a dopant into a host material, high luminance by sufficient light emission of a dopant doped into the host material in the emitting layer.

DISCLOSURE OF INVENTION

The present invention is so adapted, in an organic electroluminescent device constructed by providing at least an emitting layer using an organic material between a hole injection electrode and an electron injection electrode, that a dopant selected from coronene, rubicene, pyrene, benzpyrene, chrysene, ovalene, fluorocyclene, picene, triphenylene, aceanthrene, fluoranthene, acenaphthene, acenaphthylene, benzanthracene, naphthafluorene, naphthafluorenone, naphthapyrene, anthraquinone, rubrene peroxide, pentacene quinone, perylene quinone, naphthacene quinone, benzofluorenone, benzofluorene, anthrafluorene, benzperylene, benzpentacene, bispyrenyl propane, tetramethyl naphthacene, dibenzanthracene, pyrene quinone, perylene, and fluoracene, or their derivatives is used, and the difference between the highest occupied molecular orbital in the host material and the highest occupied molecular orbital in the dopant is in a range from −0.3 eV to +0.3 eV.

When the above-mentioned dopant is thus doped into the host material, molphology in air is hardly changed, so that the film stability of the emitting layer is improved, and the organic material used for the emitting layer is prevented from being crystallized due to heat or the like at the time of emitting light. Therefore, stable luminance is obtained for a long time.

When the difference between the highest occupied molecular orbital in the host material and the highest occupied molecular orbital in the dopant is set in a range from −0.3 eV to +0.3 eV, excitation energy is efficiently moved from the host material to the dopant. Therefore, luminous efficiency in the organic electroluminescent device is improved, so that high luminance is obtained. Particularly when the difference between the highest occupied molecular orbital in the host material and the highest occupied molecular orbital in the dopant is in a range from −0.1 eV to +0.1 eV, the excitation energy is more efficiently moved from the host material to the dopant. Therefore, the luminous efficiency is further improved, so that higher luminance is obtained.

The above-mentioned dopant is low in molecular polarity, is easily sublimated, and has high heat resistance. Therefore, a high-purity dopant is easily obtained by sublimation and purification. When the high-purity dopant which is thus obtained by the sublimation and purification is doped into the emitting layer, uniform and higher luminance is obtained for a long time.

BEST MODE FOR CARRYING OUT THE INVENTION

Description is now made of an organic electroluminescent device according to an embodiment of the present invention on the basis of the accompanying drawings.

Figure 1:
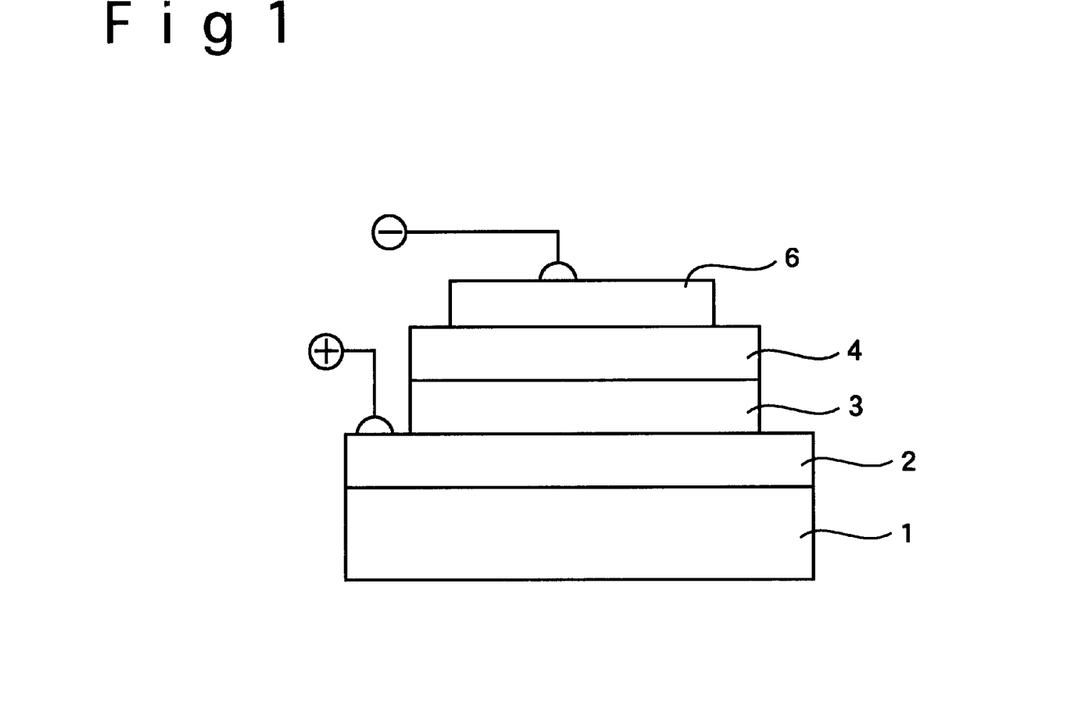
FIG. 1 is a schematic explanatory view of an organic electroluminescent device having an SH-A structure obtained by laminating a hole transport layer and an emitting layer between a hole injection electrode and an electron injection electrode.
Figure 2:
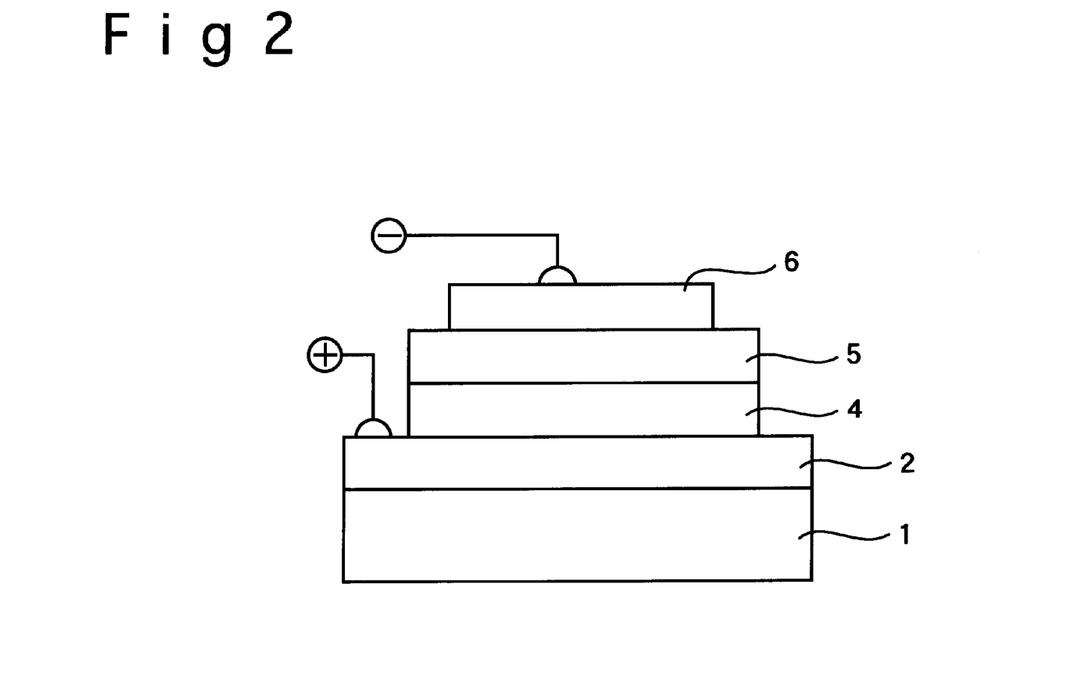
FIG. 2 is a schematic explanatory view of an organic electroluminescent device having an SH-B structure obtained by laminating an emitting layer and an electron transport layer between a hole injection electrode and an electron injection electrode.
Figure 3:
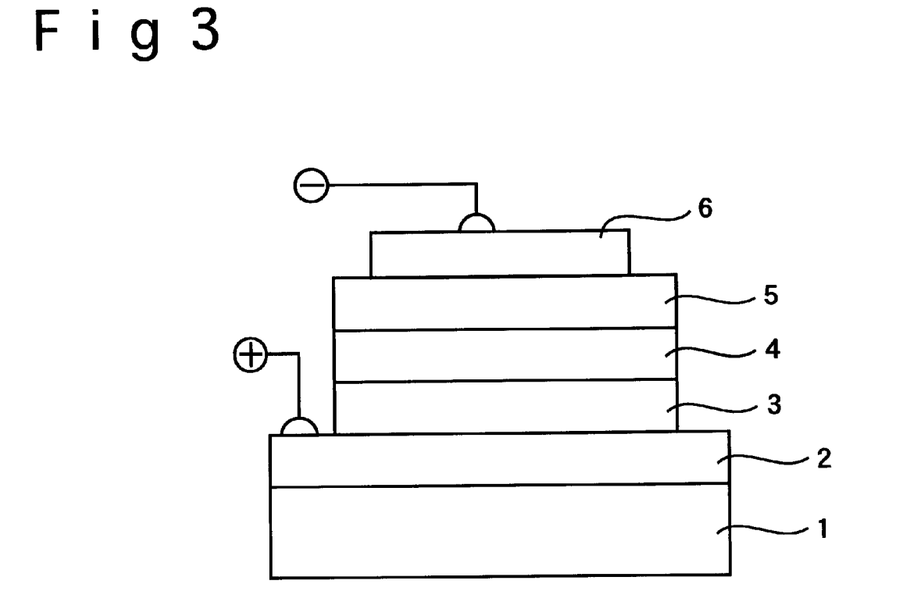
FIG. 3 is a schematic explanatory view of an organic electroluminescent device having a DH structure obtained by laminating a hole transport layer, an emitting layer and an electron transport layer between a hole injection electrode and an electron injection electrode.

The organic electroluminescent device according to the embodiment of the present invention may have any one of known structures such as an SH-A structure obtained by laminating a hole transport layer 3 and an emitting layer 4 between a hole injection electrode 2 and an electron injection electrode 6 which are formed on a transparent substrate 1 such as a glass substrate, as shown in FIG. 1, an SH-B structure obtained by laminating an emitting layer 4 and an electron transport layer 5 between the hole injection electrode 2 and the electron injection electrode 6, as shown in FIG. 2, and a DH structure obtained by laminating a hole transport layer 3, an emitting layer 4 and an electron transport layer 5 between the hole injection electrode 2 and the electron injection electrode 6, as shown in FIG. 3.

In the organic electroluminescent device according to the present embodiment, a dopant having a condensed ring obtained by condensing three or more rings is doped into a host material in the emitting layer 4, and the difference between the highest occupied molecular orbital (hereinafter referred to as HOMO) in the host material and the highest occupied molecular orbital (HOMO) in the dopant is set in a range from −0.3 eV to +0.3 eV.

In the above-mentioned organic electroluminescent device, a material having a large work function, for example, gold or an indium-tin oxide (hereinafter referred to as ITO) is used for the hole injection electrode 2, while an electrode material having a small work function, for example, a material including a magnesium alloy, an alkali metal or an alkali earth metal is used for the electron injection electrode 6. At least one of the electrodes must be made transparent in order to take out light emitted in the emitting layer 4. Generally, ITO which is transparent and has a large work function is used for the hole injection electrode 2.

Examples will be given to specifically describe the organic electroluminescent device according to the present invention, and comparative examples will be given to clarify that in the organic electroluminescent device according to the embodiment of the present invention, high luminance is obtained, and stable luminance can be obtained for a long time.

EXAMPLE 1

Figure 4:
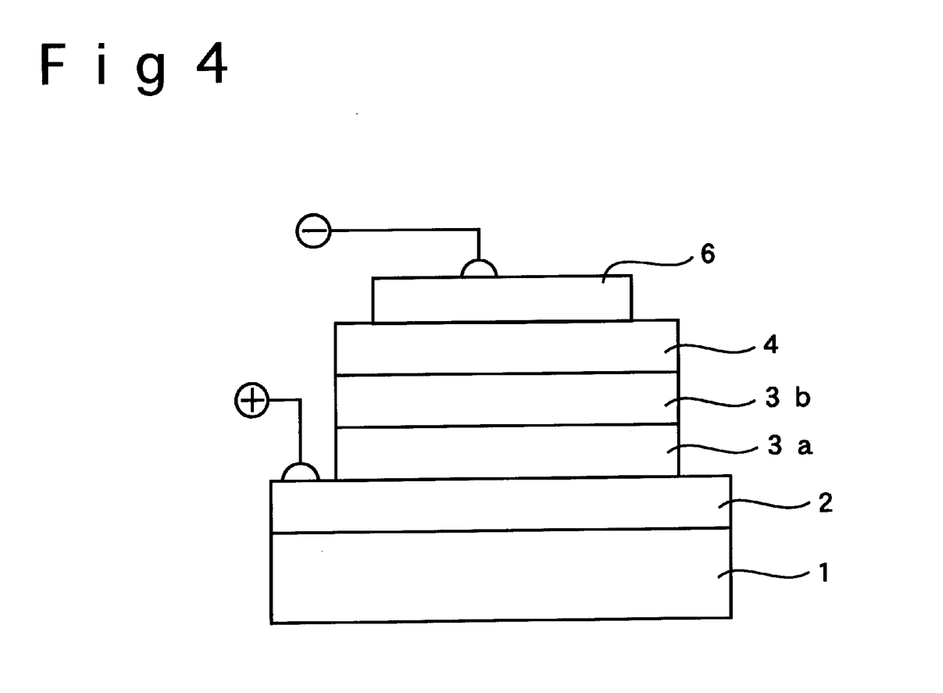
FIG. 4 is a schematic explanatory view showing structures of organic electroluminescent devices in examples 1 to 31 and comparative examples 1 to 8.

In an organic electroluminescent device in an example 1, a transparent hole injection electrode 2 having a thickness of 2000 Å was formed using the above-mentioned ITO on a glass substrate 1, and a first hole transport layer 3a having a thickness of 600 Å using a triphenylamine derivative (hereinafter referred to as MTDATA) indicated by the following chemical formula 1, a second hole transport layer 3b having a thickness of 200 Å using NPD indicated by the following chemical formula 2, an emitting layer 4 having a thickness of 500 Å obtained by doping 2% by weight of coronene having a melting point of 438° C. indicated by the following chemical formula 4 as a dopant into a host material composed of a chelate compound $Zn(OXZ)_2$ indicated by the following chemical formula 3, and an electron injection electrode 6 having a thickness of 2000 Å using a magnesium-indium alloy were laminated on the hole injection electrode 2, as shown in FIG. 4.

(Chemical formula 1)

MTDATA (Chemical formula 2)

NPD (Chemical formula 3)

Zn(OXZ)$_2$ (Chemical formula 4)

coronene

An example if coronene indicated by the foregoing chemical formula 4 to be contained as a dopant in the emitting layer 4 was one having purity of 99% obtained by sublimating and purifying commercially available coronene (produced by Tokyo Kasei Kogyo Co., Ltd.) for 12 hours using a vacumm heating type sublimating and purifying apparatus. The yield of the coronene which was thus sublimated and purified was 60%.

A method of fabricating the organic electroluminescent device in the example 1 will be specifically described. The glass substrate 1 having the hole injection electrode 2 composed of ITO formed on its surface was cleaned by a neutral detergent, was ultrasonically cleaned in extrapure water, acetone, and ethanol, respectively, for 20 minutes, 20 minutes, and 20 minutes, was further put in boiling ethanol for about one minute and taken out, and was then immediately dried by ventilation, after which the surface of the glass substrate 1 was cleaned for ten minutes using a UV-ozone cleaner.

The above-mentioned MTDATA was vacuum evaporated over the hole injection electrode 2 formed on the glass substrate 1, to form the first hole transport layer 3a, and the above-mentioned NPD was then vacuum evaporated, to form the second hole transport layer 3b. The above-mentioned Zn(OXZ)$_2$ and coronene were co-evaporated over the second hole transport layer 3b, to form the emitting layer 4, and a magnesium-indium alloy was further vacuum evaporated over the emitting layer 4, to form the electron injection electrode 6. In any case, the vacuum evaporation was performed at a degree of vacuum of $1 \times 10^{-6}$ Torr.

Comparative Example 1

An organic electroluminescent device in a comparative example 1 was obtained in the same manner as that in the above-mentioned example 1 except that only the emitting layer 4 in the organic electroluminescent device in the example 1 was changed, and only the above-mentioned Zn(OXZ)$_2$ which is the host material was used, to form an emitting layer 4.

Comparative Example 2

An organic electroluminescent device in a comparative example 2 was also obtained in the same manner as that in the above-mentioned example 1 except that only the emitting layer 4 in the organic electroluminescent device in the example 1 was changed, and 2% by weight of coumarin 4 having a melting point of 70° C. indicated by the following chemical formula 5 was doped into the above-mentioned Zn(OXZ)$_2$ which is the host material, to form an emitting layer 4.

(Chemical formula 5)

coumarin 4

In each of the organic electroluminescent devices in the example 1 and the comparative examples 1 and 2, the HOMOs in the host material and the dopant which were used in the emitting layer 4 were shown in the following Table 1.

A positive voltage and a negative voltage were respectively applied to the hole injection electrode 2 and the electron injection electrode 6 in each of the organic electroluminescent devices in the example 1 and the comparative examples 1 and 2, to find the highest luminance obtained in the organic electroluminescent device and the applied voltage at that time, and each of the organic electroluminescent devices was caused to emit light having luminance of 100 cd/m², to find a time period elapsed until the luminance is reduced by half. The results were shown in the following Table 1.

TABLE 1

| | type of host material HOMO(eV) | type of dopant HOMO(eV) | highest luminance (cd/m²) | applied voltage (V) | reduction -by-half time (hour) |
|---|---|---|---|---|---|
| example 1 | Zn(OXZ)₂ −5.6 | chemical formula 4 −5.6 | 5500 | 12 | 300 |
| comparative example 1 | Zn(OXZ)₂ −5.6 | none | 4600 | 14 | 5 |
| comparative example 2 | Zn(OXZ)₂ −5.6 | chemical formula 5 −6.0 | 1200 | 14 | 5 |

As a result, in the organic electroluminescent device in the example 1 in which the dopant having a condensed ring obtained by condensing three or more rings was used, and the difference in the HOMO between the host material and the dopant was in a range from −0.3 eV to +0.3 eV, higher luminance was obtained at a lower voltage, and a time period elapsed until the luminance is reduced by half was longer, as compared with the respective organic electroluminescent devices in the comparative examples 1 and 2 in which the above-mentioned conditions were not satisfied, so that stable luminance was obtained for a long time.

EXAMPLES 2 TO 7 and

Comparative Examples 3 and 4

Also in organic electroluminescent devices in examples 2 to 7 and comparative examples 3 and 4, only the emitting layer 4 in the organic electroluminescent device in the above-mentioned example 1 was changed, and bis(10-hydroxybenzo[h]-quinolinate)beryllium (hereinafter referred to as BeBq₂) indicated by the following chemical formula 6 was used as a host material.

(Chemical formula 6)

BeBq₂

The organic electroluminescent devices in the examples 2 to 7 and the comparative examples 3 and 4 were obtained in the same manner that in the example 1 except that an emitting layer 4 was formed using only the above-mentioned host material in the comparative example 3, while 2',3'-naphtha-2,3-fluorenone indicated by the following chemical formula 7, 2,3-anthrafluorene indicated by the following chemical formula 8, 2,3-benzofluorenone indicated by the following chemical formula 9, picene indicated by the following chemical formula 10, ovalene indicated by the following chemical formula 11, pyrene quinone indicated by the following chemical formula 12, and dioxazine carbazole indicated by the following chemical formula 13 were doped at a ratio of 2 % by weight as a dopant into the above-mentioned host material, respectively, in the example 2, the example 3, the example 4, the example 5, the example 6, the example 7, and the comparative example 4.

(Chemical formula 7)

2',3'-naphtha-2,3-fluorenone (Chemical formula 8)

2,3-anthrafluorene (Chemical formula 9)

2,3-benzofluorenone (Chemical formula 10)

picene (Chemical formula 10)

ovalene (Chemical formula 12)

pyrene quinone (Chemical formula 13)

dioxazine carbazole

In each of the organic electroluminescent devices in the examples 2 to 7 and the comparative examples 3 and 4, the HOMOs in the host material and the dopant which were used in the emitting layer 4 were shown in the following Table 2.

A positive voltage and a negative voltage were respectively applied to the hole injection electrode 2 and the electron injection electrode 6 in each of the organic electroluminescent devices in the examples 2 to 7 and the comparative examples 3 and 4, to find the highest luminance obtained in the organic electroluminescent device and the applied voltage at that time, and each of the organic electroluminescent devices was caused to emit light having luminance of 100 cd/m$^2$, to find a time period elapsed until the luminance is reduced by half. The results were shown in the following Table 2.

TABLE 2

| | type of host material HOMO(eV) | type of dopant HOMO(eV) | highest luminance (cd/m$^2$) | applied voltage (V) | reduction -by-half time (hour) |
|---|---|---|---|---|---|
| example 2 | BeBq$_2$ −5.5 | chemical formula 7 −5.6 | 20000 | 14 | 800 |
| example 3 | BeBq$_2$ −5.5 | chemical formula 8 −5.5 | 20000 | 14 | 500 |

TABLE 2-continued

| | type of host material HOMO(eV) | type of dopant HOMO(eV) | highest luminance (cd/m$^2$) | applied voltage (V) | reduction -by-half time (hour) |
|---|---|---|---|---|---|
| example 4 | BeBq$_2$ −5.5 | chemical formula 9 −5.7 | 20000 | 14 | 400 |
| example 5 | BeBq$_2$ −5.5 | chemical formula 10 −5.4 | 20000 | 14 | 500 |
| example 6 | BeBq$_2$ −5.5 | chemical formula 12 −5.7 | 20000 | 14 | 500 |
| comparative example 3 | BeBq$_2$ −5.5 | none | 18000 | 14 | 100 |
| comparative example 4 | BeBq$_2$ −5.5 | chemical formula 13 −5.0 | 200 | 14 | 20 |

As a result, in the respective organic electroluminescent devices in the examples 2 to 7 in which the dopant having a condensed ring obtained by condensing three or more rings was used, and the difference in the HOMO between the host material and the dopant was in a range from −0.3 eV to +0.3 eV, higher luminance was obtained, and a time period elapsed until the luminance is reduced by half was longer, as compared with the respective organic electroluminescent devices in the comparative examples 3 and 4 in which the above-mentioned conditions were not satisfied, so that stable luminance was obtained for a long time.

EXAMPLES 8 TO 19 and

Comparative Examples 5 and 6

Also in organic electroluminescent devices in examples 8 to 19 and comparative examples 5 and 6, only the emitting layer 4 in the organic electroluminescent device in the above-mentioned example 1 was changed, and 1AZM-Hex indicated by the following chemical formula 14 was used as a host material.

(Chemical formula 14)

1 AZM-Hex

The organic electroluminescent devices in the examples 8 to 19 and the comparative examples 5 and 6 were obtained in the same manner that in the example 1 except that an emitting layer 4 was formed using only the above-mentioned host material in the comparative example 5, while 1',2'-naphtha-2,3,-fluorene indicated by the following chemical formula 15, 2',1'-naphtha-1,2-fluorene indicated by the following chemical formula 16, 1,12-benzperylene indicated by the following chemical formula 17, 4,5-benzpyrene indicated by the following chemical formula 18, benzo(a)pyrene indicated by the following chemical 19, naphthapyrene indicated by the following chemical formula 20. 1,3-bis(1-pyrenyl)propane indicated by the following chemical for- mula 21, 5,6,11,12-tetramethyl naphthacene indicated by the following formula 22, 9,10-bis(phenylethynyl)anthracene indicated by the following chemical formula 23, fluoracene indicated by the following chemical formula 24, fluorocyclene indicated by the following chemical formula 25, perylene indicated by the following chemical formula 26, 1,2,3,4-tetraphenyl-1,3-cyclopentadiene indicated by the following chemical formula 27 were doped at a ratio of 2% by weight as a dopant into the above-mentioned host material, respectively, in the example 8, the example 9, the example 10, the example 11, the example 12, the example 13, the example 14, the example 15, the example 16, the example 17, the example 18, the example 19, and the comparative example 6.

(Chemical formula 15)

1′,2′-naphtha-2,3-fluorene (Chemical formula 16)

2′,1′-naphtha-1,2-fluorene (Chemical formula 17)

1,12-benzperylene (Chemical formula 18)

4,5-benzpyrene (Chemical formula 19)

benzo (a) pyrene (Chemical formula 20)

naphthapyrene (Chemical formula 21)

1,3-bis (1-pyrenyl) propane (Chemical formula 22)

5,6,11,12-tetramethyl naphthacene (Chemical formula 23)

9,10-bis (phenylethynyl) anthracene (Chemical formula 24)

fluoracene (Chemical formula 25)

fluorocyclene (Chemical formula 26)

perylene (Chemical formula 27)

1,2,3,4-tetraphenyl-1,3-cyclopentadiene

In each of the organic electroluminescent devices in the examples 8 to 19 and the comparative examples 5 and 6, the HOMOs in the host material and the dopant which were used in the emitting layer 4 were shown in the following Table 3.

A positive voltage and a negative voltage were respectively applied to the hole injection electrode 2 and the electron injection electrode 6 in each of the organic electroluminescent devices in the examples 8 to 19 and the comparative examples 5 and 6, to find the highest luminance obtained in the organic electroluminescent device and the applied voltage at that time, and each of the organic electroluminescent devices was caused to emit light having luminance of 100 cd/m$^2$, to find a time period elapsed until the luminance is reduced by half. The results were shown in the following Table 3.

TABLE 3

| | type of host material HOMO(eV) | type of dopant HOMO(eV) | highest luminance (cd/m$^2$) | applied voltage (V) | reduction-by-half time (hour) |
|---|---|---|---|---|---|
| example 8 | 1AZM-Hex −5.7 | chemical formula 15 −5.7 | 3000 | 18 | 500 |
| example 9 | 1AZM-Hex −5.7 | chemical formula 16 −5.7 | 3000 | 18 | 300 |
| example 10 | 1AZM-Hex −5.7 | chemical formula 17 −5.6 | 10000 | 18 | 1000 |
| example 11 | 1AZM-Hex −5.7 | chemical formula 18 −6.0 | 2500 | 18 | 300 |
| example 12 | 1AZM-Hex −5.7 | chemical formula 19 −6.0 | 2500 | 18 | 300 |
| example 13 | 1AZM-Hex −5.7 | chemical formula 20 −5.8 | 3000 | 18 | 600 |
| example 14 | 1AZM-Hex −5.7 | chemical formula 21 −5.9 | 2000 | 16 | 300 |
| example 15 | 1AZM-Hex −5.7 | chemical formula 22 −5.7 | 7000 | 16 | 1000 |
| example 16 | 1AZM-Hex −5.7 | chemical formula 23 −5.6 | 5000 | 16 | 1000 |
| example 17 | 1AZM-Hex −5.7 | chemical formula 24 −6.0 | 2000 | 16 | 300 |
| example 18 | 1AZM-Hex −5.7 | chemical formula 25 −6.0 | 3000 | 16 | 800 |
| example 19 | 1AZM-Hex −5.7 | chemical formula 26 −5.5 | 10000 | 18 | 1000 |
| comparative example 5 | 1AZM-Hex −5.7 | none | 1500 | 18 | 10 |
| comparative example 6 | 1AZM-Hex −5.7 | chemical formula 27 −5.9 | 1000 | 18 | 10 |

As a result, in the respective organic electroluminescent devices in the examples 8 to 19 in which the dopant having a condensed ring obtained by condensing three or more rings was used, and the difference in the HOMO between the host material and the dopant was in a range from −0.3 eV to +0.3 eV, higher luminance was obtained, and a time period elapsed until the luminance is reduced by half was longer, as compared with the respective organic electroluminescent devices in the comparative examples 5 to 6 in which the above-mentioned conditions were not satisfied, so that stable luminance was obtained for a long time.

EXAMPLE 20 TO 31 and

Comparative Examples 7 and 8

Also in organic electroluminescent devices in examples 20 to 31 and comparative examples 7 and 8, only the emitting layer 4 in the organic electroluminescent device in the above-mentioned example 1 was changed, and tris(8-quinolinol)aluminum (hereinafter referred to as Alq$_3$) indicated by the following chemical formula 28 was used as a host material.

(Chemical formula 28)

Alq3

The organic electroluminescent devices in the examples 20 to 31 and the comparative examples 7 and 8 were obtained in the same manner that in the example 1 except that an emitting layer 4 was formed using only the above-mentioned host material in the comparative example 7, while 1',2'-naphtha-2,3-fluorenone indicated by the following chemical formula 29, 2',1'-naphtha-1,2-fluorenone indicated by the following chemical formula 30, rubicene indicated by the following chemical formula 31, 1,2-benzpentacene indicated by the following chemical formula 32, 5,6,11,12-tetraphenyl naphthacene (rubrene) indicated by the following chemical formula 33, rubrene peroxide indicated by the following chemical formula 34, naphthacene quinone indicated by the following chemical formula 35, pentacene-5,12-quinone indicated by the following chemical formula 36, pentacene-6,13-quinone indicated by the following chemical formula 37, 3,9-perylene quinone indicated by the following chemical formula 38, 1,12-perylene quinone indicated by the following chemical formula 39, 3,10-perylene quinone indicated by the following chemical formula 40, dioxazine carbazole indicated by the foregoing chemical formula 13 were doped at a ratio of 2% by weight as a dopant into the above-mentioned host material, respectively, in the example 20, the example 21, the example 22, the example 23, the example 24, the example 25, the example 26, the example 27, the example 28, the example 29, the example 30, the example 31, and the comparative example 8.

(Chemical formula 29)

1',2'-naphtha-2,3-fluorenone (Chemical formula 30)

2',1'-naphtha-1,2-fluorenone (Chemical formula 31)

rubicene (Chemical formula 32)

1,2-penzpentacene (Chemical formula 33)

rubrene (Chemical formula 34)

rubrene peroxide

(Chemical formula 35)

naphthacene quinone

-continued (Chemical formula 36)

pentacene-5,12-quinone (Chemical formula 37)

pentacene-6,13-quinone (Chemical formula 38)

3,9-perylene quinone (Chemical formula 39)

1,12-perylene quinone (Chemical formula 40)

3,10-perylene quinone

In each of the organic electroluminescent devices in the examples 20 to 31 and the comparative examples 7 and 8, the HOMOs in the host material and the dopant which were used in the emitting layer 4 were shown in the following Table 4.

A positive voltage and a negative voltage were respectively applied to the hole injection electrode 2 and the electron injection electrode 6 in each of the respective organic electroluminescent devices in the examples 20 to 31 and the comparative examples 7 and 8, to find the highest luminance obtained in the organic electroluminescent device and the applied voltage at that time, and each of the organic electroluminescent devices was caused to emit light having luminance of 100 cd/m$^2$, to find a time period elapsed until the luminance is reduced by half. The results were shown in the following Table 4.

TABLE 4

| | type of host material HOMO(eV) | type of dopant HOMO(eV) | highest luminance (cd/m$^2$) | applied voltage (V) | reduction-by-half time (hour) |
|---|---|---|---|---|---|
| example 20 | Alq$_3$ −5.6 | chemical formula 29 −5.6 | 20000 | 16 | 800 |
| example 21 | Alq$_3$ −5.6 | chemical formula 30 −5.6 | 19000 | 16 | 600 |
| example 22 | Alq$_3$ −5.6 | chemical formula 31 −5.6 | 23000 | 16 | 2000 |
| example 23 | Alq$_3$ −5.6 | chemical formula 32 −5.5 | 18000 | 16 | 500 |
| example 24 | Alq$_3$ −5.6 | chemical formula 33 −5.4 | 21000 | 16 | 2500 |
| example 25 | Alq$_3$ −5.6 | chemical formula 34 −5.4 | 20000 | 16 | 5000 |
| example 26 | Alq$_3$ −5.6 | chemical formula 35 −5.7 | 19000 | 16 | 300 |
| example 27 | Alq$_3$ −5.6 | chemical formula 36 −5.7 | 18000 | 16 | 200 |
| example 28 | Alq$_3$ −5.6 | chemical formula 37 −5.6 | 18000 | 16 | 200 |
| example 29 | Alq$_3$ −5.6 | chemical formula 38 −5.6 | 19000 | 16 | 300 |
| example 30 | Alq$_3$ −5.6 | chemical formula 39 −5.6 | 20000 | 16 | 700 |
| example 31 | Alq$_3$ −5.6 | chemical formula 40 −5.6 | 20000 | 16 | 700 |
| comparative example 7 | Alq$_3$ −5.6 | none | 16000 | 16 | 150 |
| comparative example 8 | Alq$_3$ −5.6 | chemical formula 13 −5.0 | 200 | 14 | 30 |

As a result, in the respective organic electroluminescent devices in the examples 20 to 31 in which the dopant having a condensed ring obtained by condensing three or more rings was used, and the difference in the HOMO between the host material and the dopant was in a range from −0.3 eV to +0.3 eV, higher luminance was obtained, and a time period elapsed until the luminance is reduced by half was longer, as compared with the respective organic electroluminescent devices in the comparative examples 7 to 8 in which the above-mentioned conditions were not satisfied, so that stable luminance was obtained for a long time.

EXAMPLE 32

Figure 5:
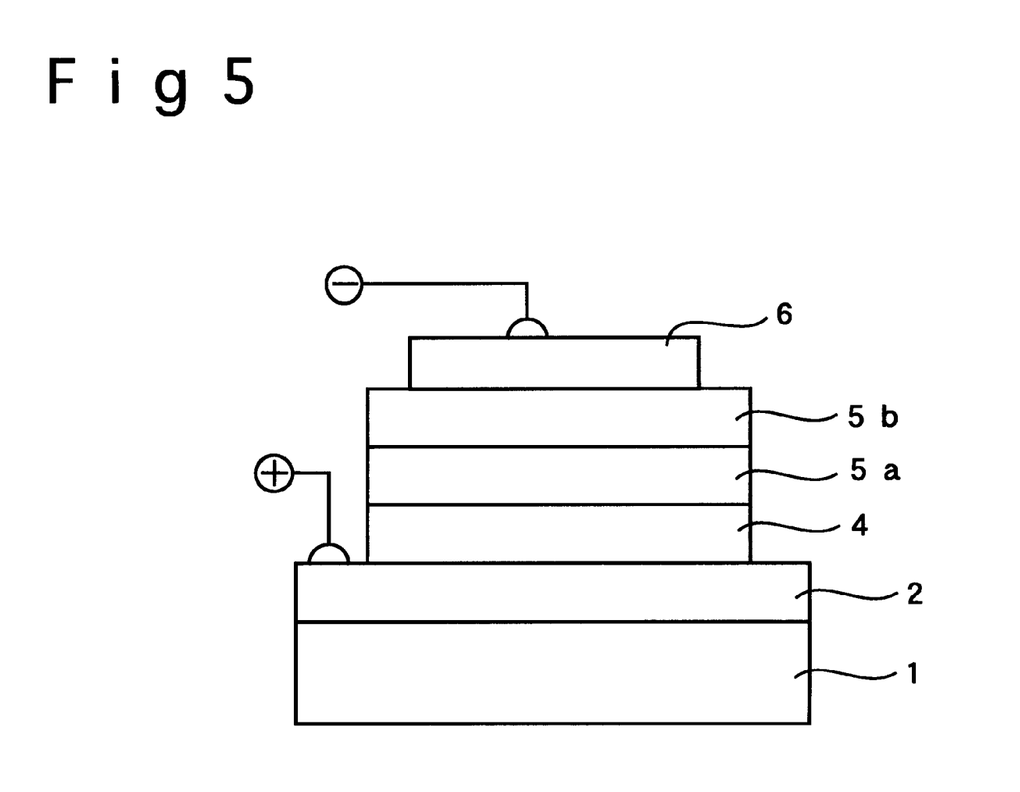
FIG. 5 is a schematic explanatory view showing structures of organic electroluminescent devices in examples 32 to 35 and comparative examples 9 and 10.

In an organic electroluminescent device in an example 32, a transparent hole injection electrode 2 having a thickness of 2000 Å was formed using the above-mentioned ITO on a glass substrate 1, and an emitting layer 4 having a thickness of 500 Å obtained by doping 2% by weight of 2',3'-naphtha-2,3-fluorene indicated by the following chemical formula 42 as a dopant into a host material composed of polyvinyl carbazole (PVCz) indicated by the following chemical formula 41, a first electron transport layer 5a, which has hole blocking properties, having a thickness of 200 Å using a triazole derivative (TAZ) indicated by the following chemical formula 43, a second electron transport layer 5b having a thickness of 300 Å using Alq₃ indicated by the foregoing chemical formula 28, and an electron injection electrode 6 having a thickness of 2000 Å using a magnesium-indium alloy were laminated on the injection electrode 2, as shown in FIG. 5.

(Chemical formula 41)

PVCz (Chemical formula 42)

2',3'-naphtha-2,3-fluorene (Chemical formula 43)

TAZ

EXAMPLE 33 TO 35
and

Comparative Examples 9 and 10

Organic electroluminescent devices in examples 33 to 35 and comparative examples 9 and 10 were obtained in the same manner as that in the above-mentioned example 32 except that only the emitting layer 4 in the organic electroluminescent device in the above-mentioned example 33 was changed, to form an emitting layer 4 using only the above-mentioned PVCz which is a host material in the comparative example 9, while the dopant to be doped into the host material using the above-mentioned PVCz was changed in the examples 33 to 35 and the comparative example 10, that is, 2% by weight of 2,3-benzofluorene indicated by the following chemical formula 44, 1,2-benzofluorene indicated by the following chemical formula 45, dibenzo(a,h)anthracene indicated by the following chemical formula 46, and 1,4-bis(5-phenyl-2-oxazolyl) benzene (hereinafter referred to as POPOP) indicated by the following chemical formula 47 were respectively doped in the example 33, the example 34, the example 35, and the comparative example 10, to form an emitting layer 4.

(Chemical formula 44)

2,3-benzofluorene (Chemical formula 45)

1,2-benzofluorene (Chemical formula 46)

dibenzo (a,h) anthracene (Chemical formula 47)

POPOP

In each of the organic electroluminescent devices in the examples 32 to 35 and the comparative examples 9 and 10, the HOMOs in the host material and the dopant which were used in the emitting layer 4 were shown in the following Table 5.

A positive voltage and a negative voltage were respectively applied to the hole injection electrode 2 and the electron injection electrode 6 in each of the organic electroluminescent devices in the examples 32 to 35 and the comparative examples 9 and 10, to find the highest luminance obtained in the organic electroluminescent device and the applied voltage at that time, and each of the organic electroluminescent devices was caused to emit light having luminance of 100 cd/m², to find a time period elapsed until the luminance is reduced by half. The results were shown in the following Table 5.

TABLE 5

| | type of host material HOMO(eV) | type of dopant HOMO(eV) | highest luminance (cd/m²) | applied voltage (V) | reduction-by-half time (hour) |
|---|---|---|---|---|---|
| example 32 | PVCz -5.6 | chemical formula 42 -5.7 | 4000 | 20 | 500 |
| example 33 | PVCz -5.6 | chemical formula 44 -5.9 | 2000 | 20 | 200 |
| example 34 | PVCz -5.6 | chemical formula 45 -5.9 | 2000 | 20 | 200 |
| example 35 | PVCz -5.6 | chemical formula 46 -5.7 | 2000 | 20 | 200 |
| comparative example 9 | PVCz -5.6 | none | 700 | 20 | 5 |
| comparative example 10 | PVCz -5.6 | chemical formula 47 -6.0 | 400 | 20 | 5 |

As a result, in the respective organic electroluminescent devices in the examples 32 to 35 in which the dopant having a condensed ring obtained by condensing three or more rings was used, and the difference in the HOMO between the host material and the dopant was in a range from –0.3 eV to +0.3 eV, higher luminance was obtained, and a time period elapsed until the luminance is reduced by half was longer, as compared with the respective organic electroluminescent devices in the comparative examples 9 to 10 in which the above-mentioned conditions were not satisfied, so that stable luminance was obtained for a long time.

The organic electroluminescent device in the present invention is not limited to those in the above-mentioned examples, and can be embodied by being suitably changed in a range in which the gist thereof is not changed.

Industrial Applicability

As described in detail above, as in the organic electroluminescent device in the present invention, in forming an emitting layer having a dopant doped into a host material, a dopant having a condensed ring obtained by condensing three or more rings is used, the difference in the HOMO between the host material and the dopant is in a range from –0.3 eV to +0.3 eV, the film stability of the emitting layer is improved, and an organic material in the emitting layer is prevented from being crystallized due to heat or the like at the time of light emission, so that stable and uniform light emission can be performed for a long time, and excitation energy is efficiently moved from the host material to the dopant. Therefore, luminous efficiency in the organic electroluminescent device is improved, so that high luminance is obtained.

Furthermore, it is also possible to improve the film stability of the emitting layer by doping the dopant into a layer other than the emitting layer.

Although only principal examples and representative materials are described herein, the present invention can be further optimized by using as these materials materials having a substituent group, for example, —$C_6H_5$, —$CH_3$, —$C_2H_5$, —$C(CH_3)_3$, —$OCH_3$, —$OCOCH_3$, —OH, —$NH_2$, —$N(CH_3)_2$, —$N(C_6H_5)_2$, —$NC_{12}H_8$, —$NHCOCH_3$, —$NH_3$, —$CF_3$, —$NO_2$, —CN, —$COCH_3$, and —$CO_2C_2H_5$.

What is claimed is:

1. An organic electroluminescent device constructed by providing at least an emitting layer using an organic material between a hole injection electrode and an electron injection electrode, characterized in that a dopant selected from coronene, rubicene, pyrene, benzpyrene, chrysene, ovalene, fluorocyclene, picene, triphenylene, aceanthrene, fluoranthene, acenaphthene, acenaphthylene, benzanthracene, naphthafluorene, naphthafluorenone, naphthapyrene, anthraquinone, rubrene peroxide, pentacene quinone, perylene quinone, naphthacene quinone, benzofluorenone, benzofluorene, anthrafluorene, benzperylene, benzpentacene, bispyrenyl propane, tetramethyl naphthacene, dibenzanthracene, pyrene quinone, perylene, and fluoracene, and derivatives of these compounds having a substituent group selected from —$C_6H_5$, —$CH_3$, —$C_2H_5$, —$C(CH_3)_3$, —$OCH_3$, —$OCOCH_3$, —OH, —$NH_2$, —$N(CH_3)_2$, —$N(C_6H_5)_2$, —$NC_{12}H_8$, —$NHCOCH_3$, —$NH_3$, —$CF_3$, —$NO_2$, —CN, —$COCH_3$, and —$CO_2C_2H_5$, is doped into a host material in said emitting layer, and the difference between the highest occupied molecular orbital in the host material and the highest occupied molecular orbital in the dopant is in a range from –0.3 eV to +0.3 eV.

2. The organic electroluminescent device according to claim 1, characterized in that any one host material selected from following chemical formulas (A) to (E) is used as the host material in said emitting layer

(A)

(B)

(C)

(D)

(E)

3. The organic electroluminescent device according to claim 1, characterized in that a dopant which can be sublimated and purified or vacuum evaporated is used.

4. The organic electroluminescent device according to claim 1, characterized in that the difference between the highest occupied molecular orbital in said host material and the highest occupied molecular orbital in said dopant is in a range from −0.1 eV to +0.1 eV.

5. The organic electroluminescent device according to claim 1, said host material being indicated by the following chemical formula (A) and said dopant being coronene.

(A)

6. The organic electroluminescent device according to claim 1, said host material being indicated by the following chemical formula (B) and said dopant being naphthafluorenone

(B)

7. The organic electroluminescent device according to claim 1, said host material being indicated by the following chemical formula (C) and said dopant being selected from benzperylene, tetramethyl naphthacene, and perylene

(C)

8. The organic electroluminescent device according to claim 1, said host material being indicated by the following chemical formula (D) and said dopant being selected from rubicene and tetramethyl naphthacene (D)

9. The organic electroluminescent device according to claim 1, said host material being indicated by the following chemical formula (E) and said dopant being naphthafluorene (E)

* * * * *